United States Patent
Anderson et al.

(10) Patent No.: US 9,654,124 B1
(45) Date of Patent: May 16, 2017

(54) COHERENT SIGNAL SOURCE

(71) Applicant: Keysight Technologies, Inc., Minneapolis, MN (US)

(72) Inventors: Keith F. Anderson, Santa Rosa, CA (US); Jean-Pierre Teyssier, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/011,306

(22) Filed: Jan. 29, 2016

(51) Int. Cl.
*H03L 7/24* (2006.01)
*H03L 7/197* (2006.01)

(52) U.S. Cl.
CPC .............. *H03L 7/24* (2013.01); *H03L 7/1974* (2013.01)

(58) Field of Classification Search
CPC ............ H03L 7/00; H03L 7/1974; H03L 7/24
USPC .................................. 327/100, 105, 106, 107
See application file for complete search history.

(56) References Cited

U.S. PATENT DOCUMENTS

| 3,372,346 A * | 3/1968 | Rogers .................... H03B 21/02 331/2 |
| 4,318,045 A * | 3/1982 | Krupa ....................... H03K 7/06 327/105 |
| 4,659,999 A | 4/1987 | Motoyama |
| 4,992,743 A * | 2/1991 | Sheffer ................. G06F 1/0342 327/106 |
| 5,084,681 A | 1/1992 | Kovalick |
| 5,298,867 A * | 3/1994 | Mestha ..................... H03L 7/00 315/500 |
| 6,066,967 A | 5/2000 | Cahill |
| 7,480,688 B2 | 1/2009 | Meckley et al. |
| 7,952,516 B2 * | 5/2011 | Atherton ................. G01S 7/282 327/105 |
| 8,115,519 B2 | 2/2012 | Turner |
| 8,878,620 B2 | 11/2014 | Sauerwein |
| 9,092,067 B2 | 7/2015 | Fawley |
| 9,520,831 B1 * | 12/2016 | Foster .................... H03B 21/02 |
| 2006/0136537 A1 * | 6/2006 | Meckley ............ G01C 21/3611 708/270 |
| 2008/0005213 A1 | 1/2008 | Holtzman |
| 2008/0284470 A1 * | 11/2008 | Park ................... G01R 33/3607 327/105 |
| 2011/0199127 A1 * | 8/2011 | Turner .................. G06F 1/0335 327/105 |
| 2014/0240004 A1 * | 8/2014 | Fawley ................. G06F 1/0335 327/106 |

* cited by examiner

Primary Examiner — William Hernandez

(57) ABSTRACT

An apparatus, a signal source, and a method for operating the same are disclosed. The apparatus includes a first signal source, a port, controller, signal synthesizer, and a first timestamp register. The port is adapted to receive a first clock signal that includes a sequence of pulses at a constant clock frequency. The signal synthesizer generates an output signal in response to inputs from the controller, the output signal having a first frequency. The first timestamp register counts pulses from the first clock signal. The controller is adapted to receive a command to change the output signal frequency from the first frequency to a second frequency, the controller causing the signal synthesizer to change the output signal frequency to the second frequency and to generate a frequency change timestamp from the timestamp register indicating a time at which the output signal changed from the first frequency to the second frequency.

17 Claims, 8 Drawing Sheets

COHERENT SIGNAL SOURCE

BACKGROUND

In many applications, one wishes to measure the phase of a sinusoidal signal relative to some point in time or another signal. Consider a sinusoid of the form $$V_1(t) = A_1 \cos(\omega_1 t + \theta_1) \quad (1)$$

The phase that is measured when the signal is measured is the instantaneous phase given by $$\Phi_1(t) = \omega_1 t + \gamma_1 \quad (2)$$

This phase depends on the time at which the signal is measured. In general, the difference in phase between two signals is the quantity of interest. Denote the second signal by $$V_2(t) = A_2 \cos(\omega_2 t + \theta_2) \quad (3)$$

The phase difference $\Phi_2 - \Phi_1 = (\omega_2 - \omega_1)t + (\theta_2 - \theta_1)$. This quantity is only time invariant if the frequencies of the two signals are the same. Hence, defining a phase difference that is independent of the time at which the signals are measured presents challenges if the frequencies of the two signals are different from one another.

SUMMARY

The present invention includes an apparatus, a signal source, and a method for operating the same. The apparatus includes a first signal source, a port, controller, signal synthesizer, and a first timestamp register. The port is adapted to receive a first clock signal that includes a sequence of pulses at a constant clock frequency. The signal synthesizer generates an output signal in response to inputs from the controller, the output signal having a first frequency. The first timestamp register counts pulses from the first clock signal. The controller is adapted to receive a command to change the output signal frequency from the first frequency to a second frequency, the controller causing the signal synthesizer to change the output signal frequency to the second frequency and to generate a frequency change timestamp from the timestamp register indicating a time at which the output signal changed from the first frequency to the second frequency.

In one aspect of the invention, the output signal is characterized by a phase and the controller sets the output signal to a known phase in response to a phase setting command and generates a timestamp indicating when the phase was changed to the known phase.

In another aspect, the signal synthesizer changes frequency at times determined by the first clock signal.

In another aspect, the controller computes a second frequency reference phase corresponding to the second frequency from the frequency change timestamp, a first frequency reference phase, and the first and second frequencies.

In yet another aspect, the signal synthesizer is a direct digital synthesizer (DDS) or a fractional-N synthesizer.

In another aspect, the apparatus also includes a mixer characterized by an input port, a local oscillator (LO) port, and an IF output port, the output signal is connected to the LO port.

In another aspect, the apparatus further includes a receiver having a receiver signal port connected to the IF port. An analog-to-digital converter (ADC) generates one digital value from an IF signal leaving the IF port in response to each clock pulse from an ADC clock. The apparatus also includes an ADC clock register that includes an ADC timestamp value that is incremented on each clock pulse from the ADC clock. A processor records a sequence of the digital values starting at a first time and the ADC timestamp value at the first time.

In another aspect, the processor causes the controller to change the first frequency to the second frequency and reads the frequency change timestamp generated by changing the first frequency to the second frequency. The processor determines a phase of a component of the IF signal after the controller changes the first frequency to the second frequency, the phase of the component is independent of the phase changes introduced by the change in frequency from the first frequency to the second frequency. The processor causes the ADC to generate a sequence of digital values starting at a starting time, the sequence of digital values is processed by the processor to determine the phase of the component, the determined phase being independent of the starting time.

In yet another aspect, the apparatus includes first and second component frequency sources and a common reference source that generates a common reference source signal. Each component frequency source includes a reference clock that generates a clock signal which includes a sequence of pulses at a constant clock frequency. Each component frequency source includes a controller, a signal synthesizer, a reference clock, and a timestamp register. The signal synthesizer generates an output signal in response to inputs from the controller, the output signal having a first frequency determined by the first clock frequency. The timestamp register counts pulses from the clock signal. The controller is adapted to receive a command signal that indicates a change in the output signal frequency to a second frequency or a change in the output signal phase to a new phase, the controller causing the signal synthesizer to change the output signal to a new output signal having the second frequency or the new phase, respectively, and to generate a frequency change timestamp from the timestamp register indicating a time at which the output signal changed. The common reference source couples the common reference source signal to each of the reference clocks in the component frequency sources. The constant clock frequency in each of the component frequency sources is synchronized to the common reference source signal.

The method of the present invention determines the phase of a tone generated by a signal synthesizer when the signal synthesizer output changes frequency from a first frequency to a second frequency at time, $t_s$. The method includes providing a clock register that is incremented at a constant rate and not reset while the signal synthesizer is utilized for a measurement of interest that depends on the phase. The method also includes generating a timestamp from the clock register at $t_s$; and determining the phase of the tone at times after $t_s$ from the timestamp, the first and second frequencies and a phase of the tone at a known value of the clock register at a time prior to $t_s$.

In another aspect, the method also includes causing the signal synthesizer to change from the first frequency to the second frequency at a time determined by a time at which the clock register was incremented.

In another aspect, the method further includes setting the phase of the signal synthesizer to a known phase at a time prior to $t_s$ and generating a timestamp from the clock register at that time.

DETAILED DESCRIPTION

In the following discussion, the timezero phase of a sinusoidal signal is defined to be the phase of the signal at timezero, that is, $\theta_1$ in Eq. (2). While the instantaneous phase difference between $V_1(t)$ and $V_2(t)$ is a function of t, the timezero phase difference $(\theta_2-\theta_1)$ is invariant even in the case in which the two signals have different frequencies. Furthermore, even in the case in which the second signal is measured with respect to a different time scale that is offset relative to the time scale used to define the first signal, the timezero phase of the difference signal is still invariant. In this case, the timezero phase of the difference signal is $\Phi_2(t_0)-\Phi_1(0)-\omega_2 t_0$, where to is the offset of the two time scales. Hence, if the time, $t_0$, offset is known, the timezero phase difference can be computed and used in measurements made using the two signals in question. The present invention provides a mechanism for keeping track of the time at which the frequencies of a signal generator are changed so that the difference in time of the timezero phases can be obtained.

Figure 1:
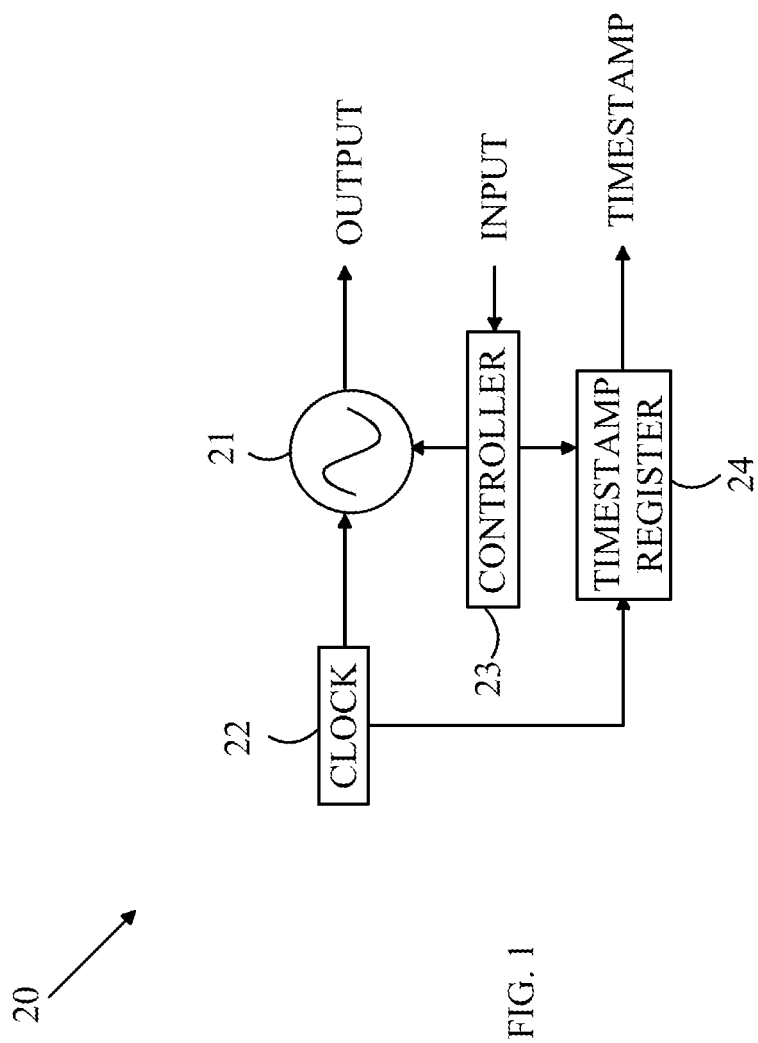
FIG. 1 illustrates one embodiment of a signal generator according to the present invention.

The manner in which the present invention provides its advantages can be more easily understood with reference to FIG. 1, which illustrates one embodiment of a signal generator according to the present invention. In signal generator 20, a variable frequency sine wave generator 21 has an output that is controlled by a reference oscillator, which in this embodiment is reference clock 22. A register, referred to hereinafter as a timestamp register, counts the clock pulses. The timestamp register is reset prior to any use of any signals from signal generator 20 and has sufficient bits that it will not overflow during the time in which signal generator 20 is in operation. Hence, timestamp register 24 stores an absolute time index that characterizes signal generator 20. A controller 23 sets the frequencies of sine wave generator 21 in response to input commands that specify the desired output frequency. When controller 23 receives a command to change the frequency of the output, controller 23 provides the relevant changes to sine wave generator 21 and reads out timestamp register 24 to generate a timestamp.

Figure 2:
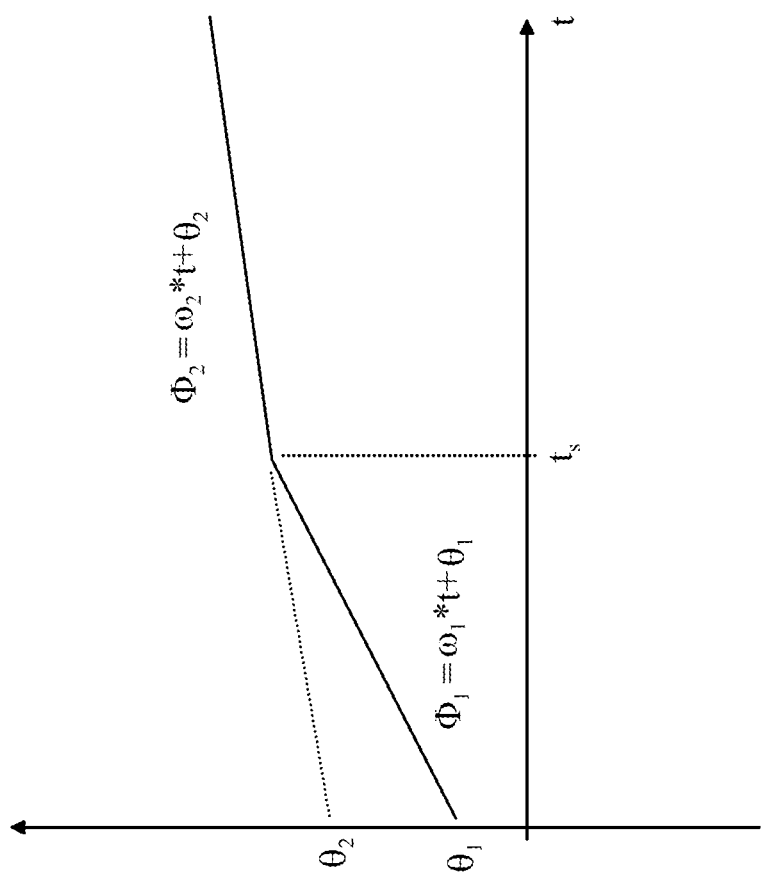
FIG. 2 illustrates the phase of the signal from signal generator 20 when the frequency is switched from $\omega_1$ to $\omega_2$ at a time, timestamp.

Refer now to FIG. 2, which illustrates the phase of the signal from signal generator 20 when the frequency is switched from $\omega_1$ to $\omega_2$ at a time, timestamp. During the first period, the signal has a frequency $\omega_1$, and the phase evolves over time according to $\Phi_1(t)=\omega_1 t+\theta_1$. In the second period, the phase evolves over time according to $\Phi_2(t)=\omega_2 t+\theta_2$. At $t_s$, $\Phi_2(t_s)=\Phi_1(t_s)$; hence, $\theta_2=\theta_1+(\omega_1-\omega_2)t_s$. Hence, knowing the timestamp allows the user of signal generator 20 to know the timezero phase of the signal after the frequency change.

In the above example, the phase of the signal after the frequency change is known relative to the phase of the signal prior to the frequency change. Hence, if the phase prior to the frequency change is known at one point in time, the phase of the signal at any future point after that point in time can be computed. Hence, if sine wave generator 21 can be reset to a known phase and the time at which the reset took place is recorded in a timestamp, the absolute phase to the output of signal generator 20 is known even across frequency changes.

Figure 3:
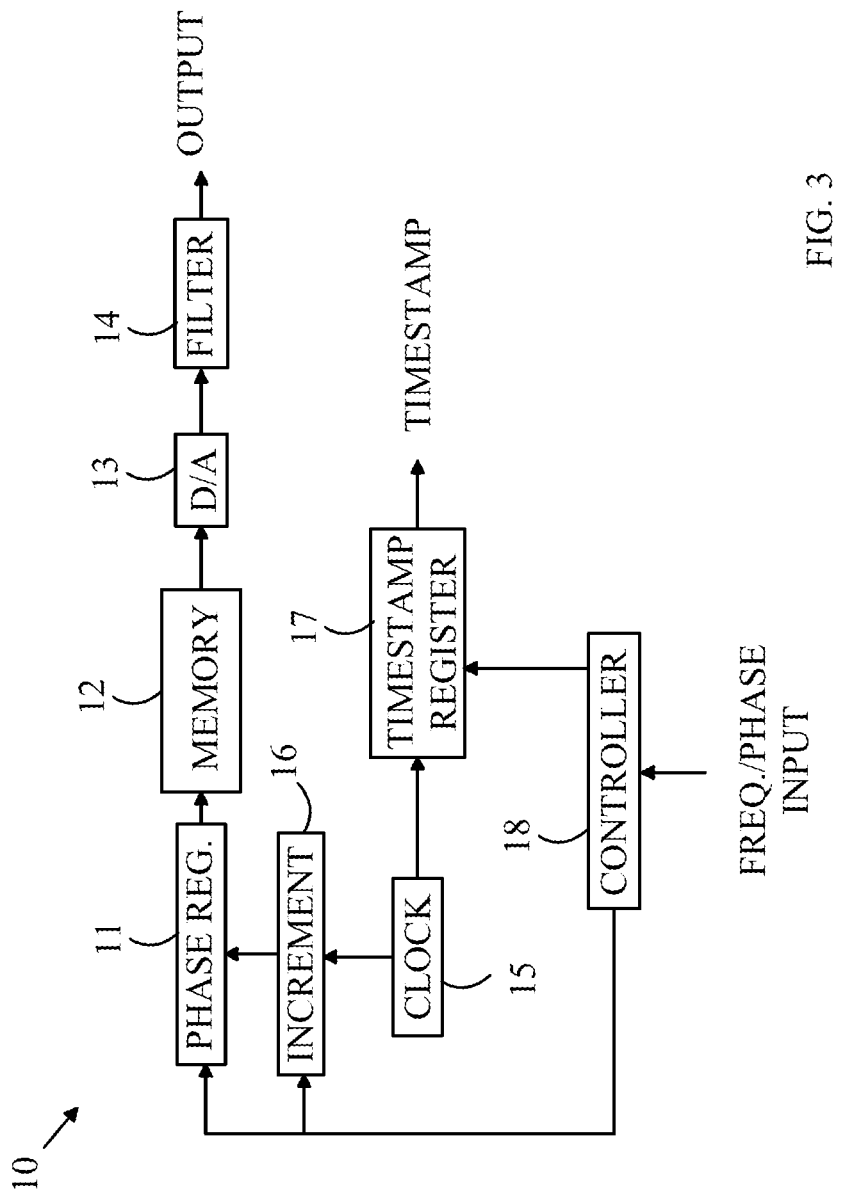
FIG. 3 illustrates an embodiment of the present invention in which the sine wave generator is a DDS.

The above example assumes that sine wave generator 21 does not change phase during the switching of the frequency of the output between $\omega_1$ and $\omega_2$. Refer now to FIG. 3, which illustrates an embodiment of the present invention in which the sine wave generator is a DDS. A DDS stores a digital representation of a sine wave in memory 12. The representation is essentially a table of amplitude values as a function of the phase of the sine wave. At any given time, the phase of the output signal is specified in phase register 11 which is a pointer into the table. The register is incremented by each cycle of clock 15. The output of memory 12 is then converted to an analog value by digital-to-analog converter (D/A) 13. The output of D/A 13 is filtered by filter 14 to remove the noise introduced by the digital stepping of the amplitude values. The frequency of the output sine wave is determined by the clock 15 and a value stored in an increment register 16. On each clock cycle, phase register 11 is incremented by the amount stored in increment register 16. The higher the value in increment register 16, the higher the frequency of the output. For example, assume memory 12 stores 360 sine wave values corresponding to phase 0 to 359 degrees. If increment register 16 stores a 1, then one cycle of the sine wave will take 360 clock cycles. If, on the other hand, increment register 16 stores a 2, one cycle will require only 180 clock cycles, and the output frequency will be twice as fast.

Signal generator 10 also includes a timestamp register 17 that counts the pulses from clock 15. Timestamp register 17 is reset once when signal generator 10 is started and not reset again during the period in which signal generator 10 is being used. The size of timestamp register 17 is sufficient to ensure that the count in timestamp register 17 will not overflow. When controller 18 receives a command to change the output frequency, controller 18 changes increment register 16 and records the contents of timestamp register 17. Since the change only involves changing the increment in increment register 16, the phase of the output does not change at the switch point. Hence, the arrangement shown in FIG. 3 satisfies the conditions discussed above.

It should be noted that signal generator 10 could also change the phase of the output at any time by incrementing or decrementing the contents of the phase register directly using controller 18. Hence, if, for example, the timezero phase of the signal at the new frequency was to match the timezero phase of the prior signal, controller 18 would also decrement the phase register by an amount corresponding to $(\omega_1-\omega_2)t_s$. In addition, resetting phase register 11 to a known value and recording the time at which the reset took place in a timestamp allows the absolute phase of the output signal to be known from that point in time forward.

Figure 4:
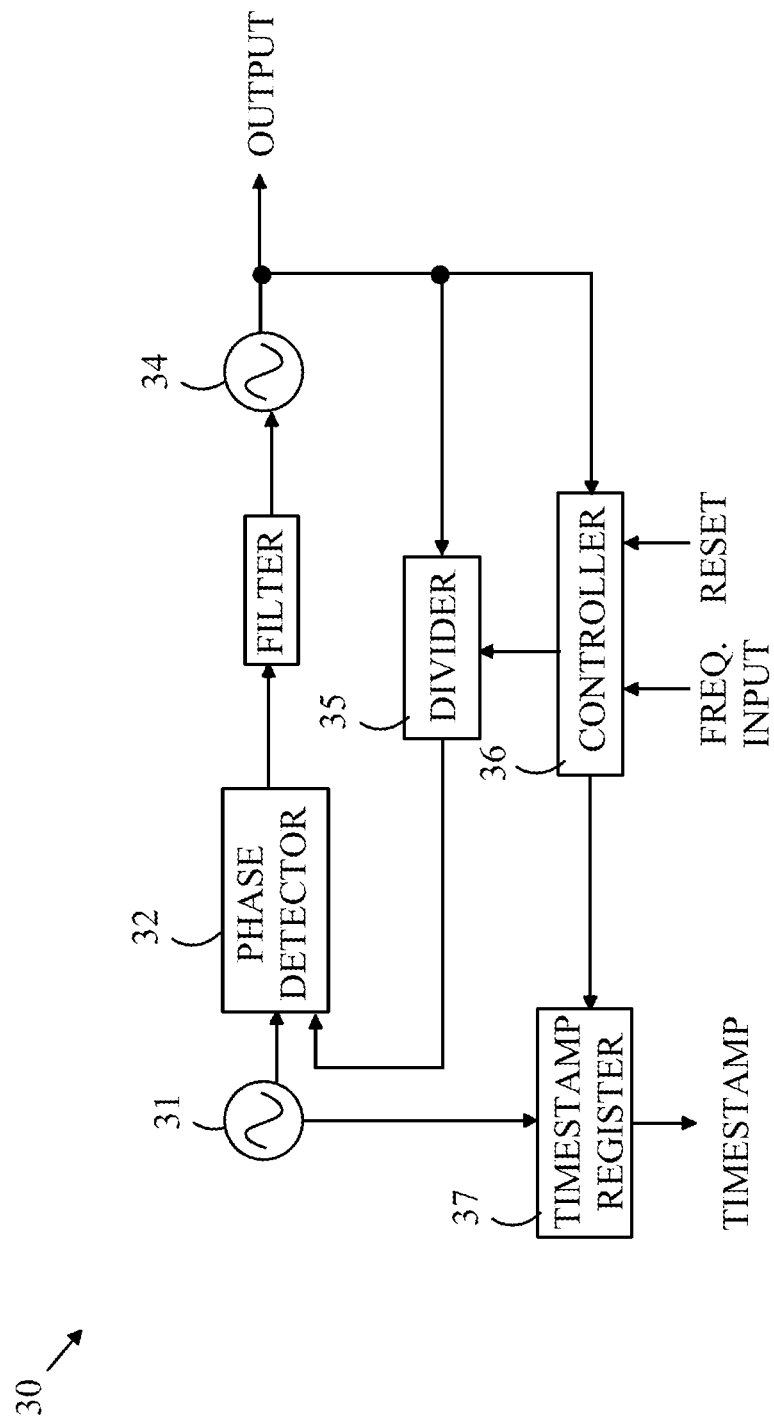
FIG. 4 illustrates an embodiment of the present invention in which the sine wave generator is a fractional-N synthesizer.

The timestamp technique of the present invention can also be used with signal generators that utilize fractional-N synthesizers. Refer now to FIG. 4, which illustrates an embodiment of the present invention in which the sine wave generator is a fractional-N synthesizer. A fractional-N synthesizer uses a phase lock loop to set the frequency of a voltage-controlled oscillator (VCO) 34 to a value that depends on a reference signal 31. The output of VCO 34 is divided by divider 35 and fed into a phase detector 32 that generates a signal related to the phase difference of the reference signal and the output signal divided by the value in divider 35. For a fixed divider, the output frequency of signal generator 30 is the frequency of the reference signal times the divisor. Hence, for a fixed divisor, the output frequencies are limited to multiples of the reference frequency. A fractional-N synthesizer can provide output values between these multiples by switching the divisor value back and forth between two values. The output frequency then depends on the two frequency values corresponding to the two divisors and the fraction of the time the divisor is set to each value.

Figure 5:
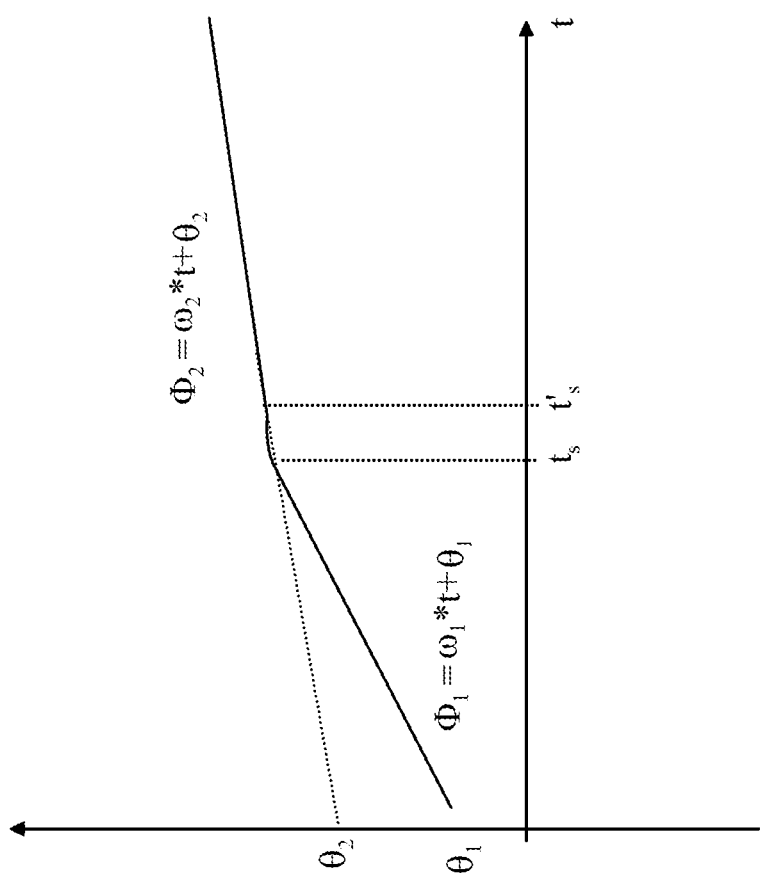
FIG. 5 illustrates the phase of the output as a function of time after the frequency is switched in a fractional-N synthesizer starting at time $t_s$.

When controller 36 receives an input to change frequencies, controller 36 outputs a timestamp from timestamp register 37 corresponding to the time of the frequency change. The ratio of the two divisors is then changed to reflect the new desired output frequency. As discussed above, timestamp register is reset once before signal generator 30 is started and is not subsequently reset. Timestamp register 37 counts the reference signal pulses. The frequency change starts on a clock pulse. However, it takes some time for the new frequency to settle to the desired value. Refer now to FIG. 5, which illustrates the phase of the output as a function of time after the frequency is switched starting at time $t_s$. While the phase is uncertain between $t_s$ and $t_s'$, the phase will settle to the correct linear relationship. At that point, the timezero phase is the same as in the DDS case discussed above.

In the case of fractional-N synthesizer-based signal generators, there is a limit to the rate at which the frequency can be changed and still maintain the relationships with respect to the timezero phase. If the frequency is shifted too fast, the phase-locked loop will become unlocked. If this happens, the phase of the output signal will become uncontrolled, and hence, the resulting phase of the output signal cannot be determined. Hence, frequency shifts must be performed sufficiently slow to ensure that the phase locked loop does not unlock.

It should be noted that a fractional-N synthesizer can be reset to a reset phase for any given frequency in response to a command to the controller. As noted above, a fractional-N synthesizer operates by shifting the divider value between two values in a manner such that the weighted average of the divisors generates the desired frequency from the synthesizer. For example, the divisor could be 100 for 10 cycles and 101 for 10 cycles to generate an output frequency that corresponds to a divisor of 100.5. To avoid artifacts such as spurs in the output signal, the actual pattern of switching between the divisors is determined by a pseudo-random switching sequence which provides the desired weighted average while avoiding spurs generated from a regular switching pattern. If the switching sequence is restarted from the beginning, the phase of the output signal will return to the same value as generated the last time the sequence began from this point. Controller 36 has an input that allows this sequence to reset to a predetermined starting point. However, to determine the value of this phase, a calibration procedure must be performed. If such a calibration is available, the absolute phase of the output signal can be determined from the time of the reset onward.

A frequency source according to the present invention is particularly useful as the LO for a mixer. In a number of measurements, a test signal is down-converted in a mixer a number of times to measure different components of the test signal. At each down-conversion, the frequency of the mixer LO is changed. As noted above, the present invention allows the phase change of the LO signal to be determined, and hence, the phase of the components of the IF signal from the mixer can also be determined relative to the phase of the components that were previously measured. In prior art systems, the phase of the mixer at the new frequency is not known relative to the phase at the previous frequency, and hence, if that information is needed to process the measurements of the test signal in question, some other means for determining the phase of the new output from the mixer is needed. These other methods introduce errors, particularly in the presence of noise.

Figure 6:
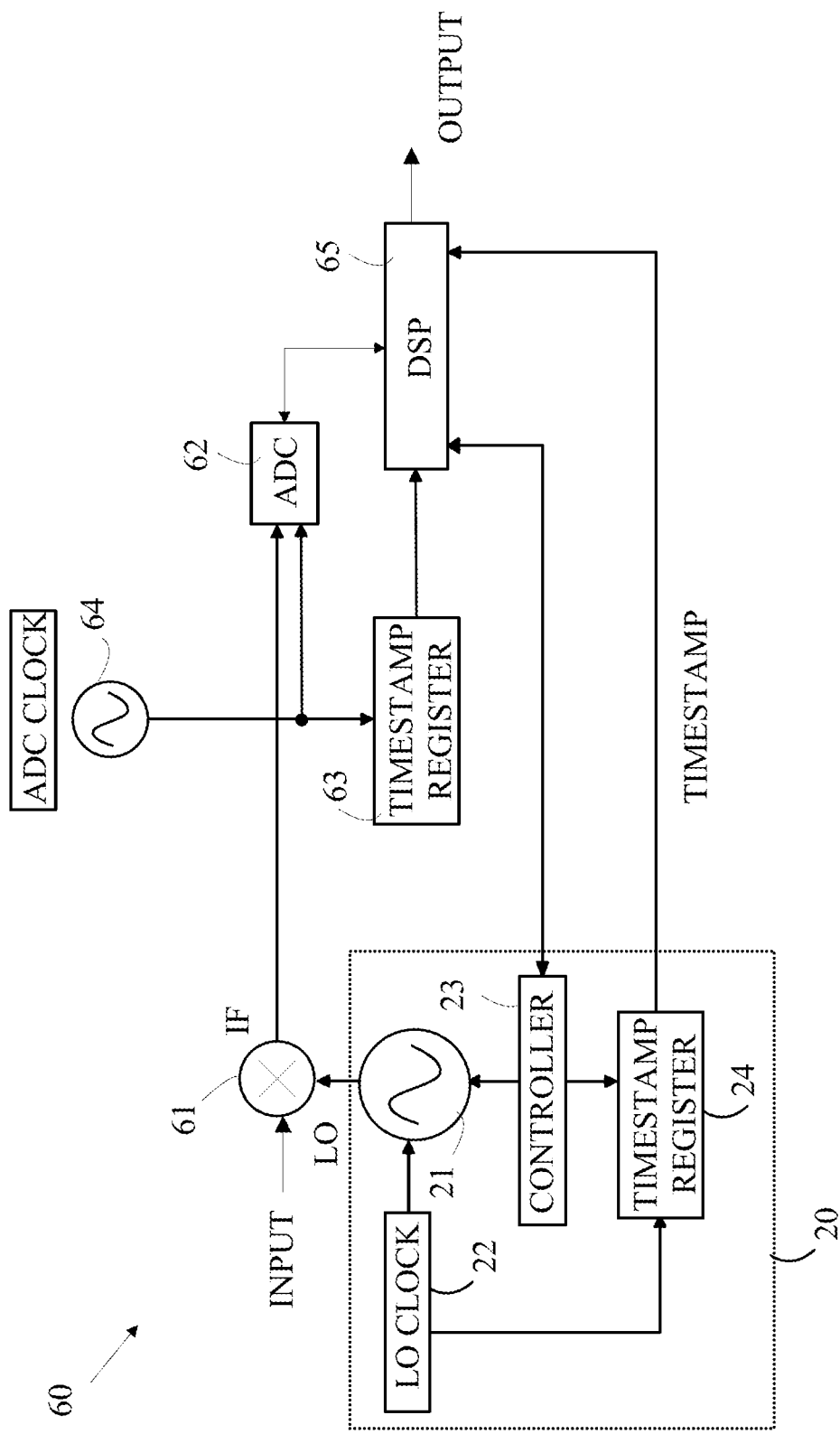
FIG. 6 illustrates a mixer-based measurement system 60 that utilizes a coherent signal source according to one embodiment of the present invention.

Refer now to FIG. 6, which illustrates a mixer-based measurement system 60 that utilizes a coherent signal source according to one embodiment of the present invention. A repetitive input signal is input to a mixer 61. Any repetitive signal can be represented by a harmonic series having a plurality of tones, each tone being characterized by a phase that changes over time. The output of mixer 61 is an IF signal that has been down-converted to a new frequency range. To simplify the discussion, the filter that removes the unwanted component of the IF signal has been omitted. For the purposes of the present discussion, it is sufficient to note that the IF signal has one or more tones. Each tone in the IF signal is characterized by a frequency and a phase that changes over time. In many measurements of interest, the amplitude and phases of the tones in the input signal are to be determined from the amplitudes and phases of the components of the IF signal. Typically, this is accomplished by digitizing the IF signal using an A/D converter such as ADC 62 and processing the digital time domain signal in a digital signal processor (DSP) 65, which performs an FFT on the sequence to arrive at a set of amplitudes and phases for the components in the IF signal. While the amplitudes for the IF frequency components are independent of the phase of the LO and the time at which the ADC sampling begins, the phases measured by DSP 65 depend on both of these factors.

Consider a tone in the input signal. That tone is characterized by a phase. That tone is down-converted to a corresponding tone in the IF signal by mixer 61. The corresponding tone of the IF signal has a phase that is offset from the phase in the input signal for that tone by an amount that depends on the phase of LO signal relative to the phase of the tone in the input signal. If the phase of the LO is known, then the phase of the tone in the IF signal relative to the phase of that tone in the input signal can be determined. The timestamp generated from timestamp register 24 allows DSP 65 to determine the phase of the LO signal relative to the timezero phase of the output of sine wave generator 21.

The phase of each tone in the IF signal changes over time. The IF signal can be represented by a signal S(t) of the form $$S(t)=A_0+\Sigma A_k \cos(k\omega t+\theta_k) \quad (4)$$

where $A_k$ is the amplitude of the $k^{th}$ tone, $\theta_k$ is the phase of the $k^{th}$ tone and $k\omega$ is the frequency of that tone. Consider the measurement of S in a system in which the time coordinates are offset by an amount to relative to system in Eq. (1). Denote time in the new system by t'. Here, $t'=t-t_0$.

$$S(t)=A_0+\Sigma A_k \cos(k\omega(t'+t_0)+\theta_k)=A_0+\Sigma A_k \cos(k\omega(t')+\Phi_k) \quad (5)$$

where $$\Phi_k=k\omega t_0+\theta_k \quad (6)$$

Here, $\Phi_k$ is the phase that would be measured in the new time system. From the equation above, it is clear that the amplitudes of the tones do not depend on the choice of the t=0 point in time, but the phases do. Consider the case in which all $\theta_k$ are 0. That is, in the original time coordinate system, $\theta$ as a function of k is 0. In the new coordinate system, the phases, $\Phi_k$ now are a linear function of k. DSP 65 measures the IF signal in a time coordinate system that offsets from that time coordinate system of the LO or the input signal. Hence, to compute the phases of the IF signal from the phases measured by DSP 65, a knowledge of the time offset between the two systems is needed. i.e., the value of $t_0$. This time offset is determined by the time at which the digital sequence that is analyzed by DSP 65 is begun. If only one LO frequency is used and only one digital signal is converted, the uncertainty in to leads to a fixed phase offset that is unknown; however, the relative phases of the components can be determined. If, on the other hand, two sets of measurements are to be made at different LO frequencies and times, the phases in the second set of measurements will have a different phase slope and offset than the phases measured in the first set of measurements. As a result, combining the two sets of measurements presents significant challenges.

Since the t=0 point on the time scale is arbitrary, assume that the first set of measurements is performed at t=0. The second set of measurements is begun at $t=t_0$. When DSP 65 commences recording a sequence of measurements from ADC 62, DSP 65 records a timestamp from timestamp register 63. ADC 62 digitizes the IF signal in response to an ADC clock 64. The pulses from ADC clock 64 are also counted in timestamp register 63. Timestamp register 63 is analogous to timestamp register 24 in that it is reset once at some time prior to the measurements being made and not reset thereafter. The size of timestamp register 63 is sufficient to ensure that the count stored therein will not overflow during the course of the measurements. Hence, DSP 65 "knows" the timestamp values at t=0 and $t=t_0$. From these measurements, the phase slope of the second set of measurements relative to the first set of measurements can be determined. The phase offset of the second set of measurements relative to the first set of measurements can then be determined from the timestamp generated from timestamp register 24 at each point in time at which the frequency of the LO is changed, since the timezero phase of the LO signal at each frequency change relative to the previous timezero phase is known, and hence, the phase of the new LO signal relative to the previous timezero phase can be computed as a function of time as measured by the LO clock.

The manner in which a measurement apparatus based on mixer-based measurement system 60 can be used in systems that utilize "stitching" to piece together a spectrum for a test signal that has much greater bandwidth than that of the receiver will now be discussed in more detail. Consider a case in which the input to mixer 61 shown in FIG. 6 has a bandwidth that is much larger than the bandwidth that can be measured in mixer-based measurement system 60 from one sequence of ADC values. For example, the input signal could have a bandwidth of 100 MHz while DSP 65 can only generate a signal having a bandwidth of 20 MHz. The goal of the system is to generate a spectrum covering the entire 100 MHz range from a number of components measuring 20 MHz spectra. In conventional analyzers, the receiver would measure six or more overlapping spectra by varying the frequency of signal generator 20. Each component spectrum would have a bandwidth of 20 MHz and a frequency range that would partially overlap that of a neighboring component frequency. While combining the component amplitude spectra is straightforward, stitching together the phases to provide a phase as a function of frequency that could have been obtained from a single 100 MHz receiver presents significant challenges, because each component spectrum has a different to value and corresponds to a different LO frequency which introduces another phase offset.

In the prior art, the component spectra are chosen such that the spectra overlap one another in a manner in which a known frequency component is present in both spectra. The overlapped data is then used to calculate the relative phase offset of the two component spectra and the relative starting times for the component spectra. One problem with this technique is that measurement noise can cause errors in the alignment. To reduce the errors, the overlap areas must be very large, which increases the number of component spectra that must be utilized to span the desired frequency range.

Refer now to FIGS. 7A-7F, which illustrate the manner in which a mixer-based measurement system 60 can be used to perform a spectrum stitching measurement. To simplify the following discussion, the present example requires only two component spectra to provide a stitched spectrum; however, it will be apparent from this example that the procedure can be expanded to provide for stitching many more component spectra. Once again, the amplitude spectra have been omitted from the drawing; however, it is to be understood that there is a corresponding amplitude spectrum for each of the phase spectra discussed here.

Figure 7A:
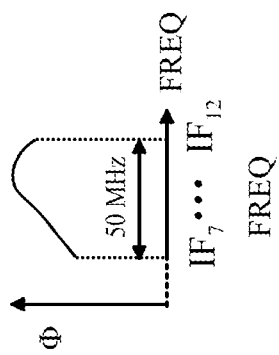
FIGS. 7A-7F illustrate the manner in which a mixer-based measurement system 60 can be used to perform a spectrum stitching measurement.
Figure 7B:
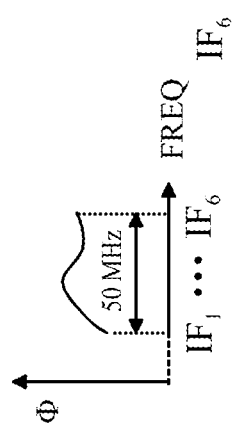

For the purposes of this example, an input signal having a 100 MHz frequency band of interest is assumed as shown in FIG. 7A. It will be assumed that there are 12 tones of interest, $\omega_1$ through $\omega_{12}$, in this input signal. This repetitive signal is input to mixer 61 which uses signal generator 20 to down-convert the spectrum to a first component IF signal shown at FIG. 7B. The frequency of signal generator 20 is set by DSP 65 that also acts as the overall controller for the system. The component spectrum shown in FIG. 7B includes down-converted tones $IF_1$ through $IF_6$, which correspond to $\omega_1$ through $\omega_6$ in the input signal and has a bandwidth of approximately 50 MHz. This IF signal is digitized by the receiver in the manner discussed above to generate a first timezero phase spectrum, $^1\theta_i$, for I=1 to 6. Here, $^1\theta_i = ^1\Phi_i(t_1) - IF_i*Ts/F$, where $^1\Phi_i(t_1)$ is the $i^{th}$ phase generated by the FFT of the sequence of ADC measurements that started at the time Ts recorded in the timestamp of the phase clock at the start of the measurement. The first timezero spectrum is shown in FIG. 7D.

Figure 7C:
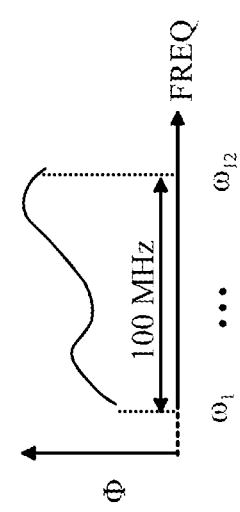
Figure 7D:
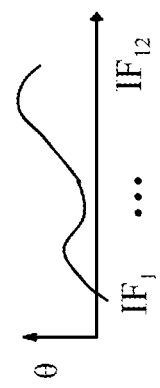
Figure 7E:
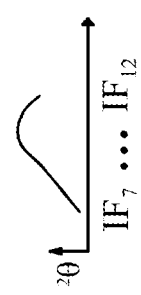
Figure 7F:
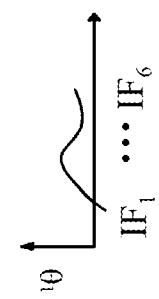

After timezero phase spectrum has been generated, DSP 65 sets the frequency of signal generator 20 such that the IF signal has the phase spectrum shown in FIG. 7C and spans frequencies $IF_7$ through $IF_{12}$. DSP 65 records the timestamp from timestamp register 24 at the LO frequency change, and hence, can compute the timezero offsets introduced by the frequency change. DSP 65 then generates a timezero phase spectrum, $^2\theta_i$, spanning tones $IF_7$ through $IF_{12}$ obtained as shown in FIG. 7E from the second portion of the input signal shown in FIG. 7C. As noted above, the switching of the LO frequency introduces a phase shift that results in a constant phase being added to each component of the second timezero phase spectrum. The timezero phase determined from the timestamp at the frequency change is used to determine this offset. Hence, this offset is added to each of the $^2\theta_i$ to correct for the offset. The resultant stitched phase spectrum is shown in FIG. 7F.

In the above-described embodiment, the higher tone segment is stitched to the lower tone segment. However, the order in which the two component signals are stitched can be varied. For example, the higher frequency signal can be kept as the growing component with each lower frequency segment being added to that component.

In the above-described embodiments, the timestamp registers count clock pulses. It should be noted that the registers can include a divider such that only every nth clock pulse is actually counted if the clock frequency is sufficiently high.

Figure 8:
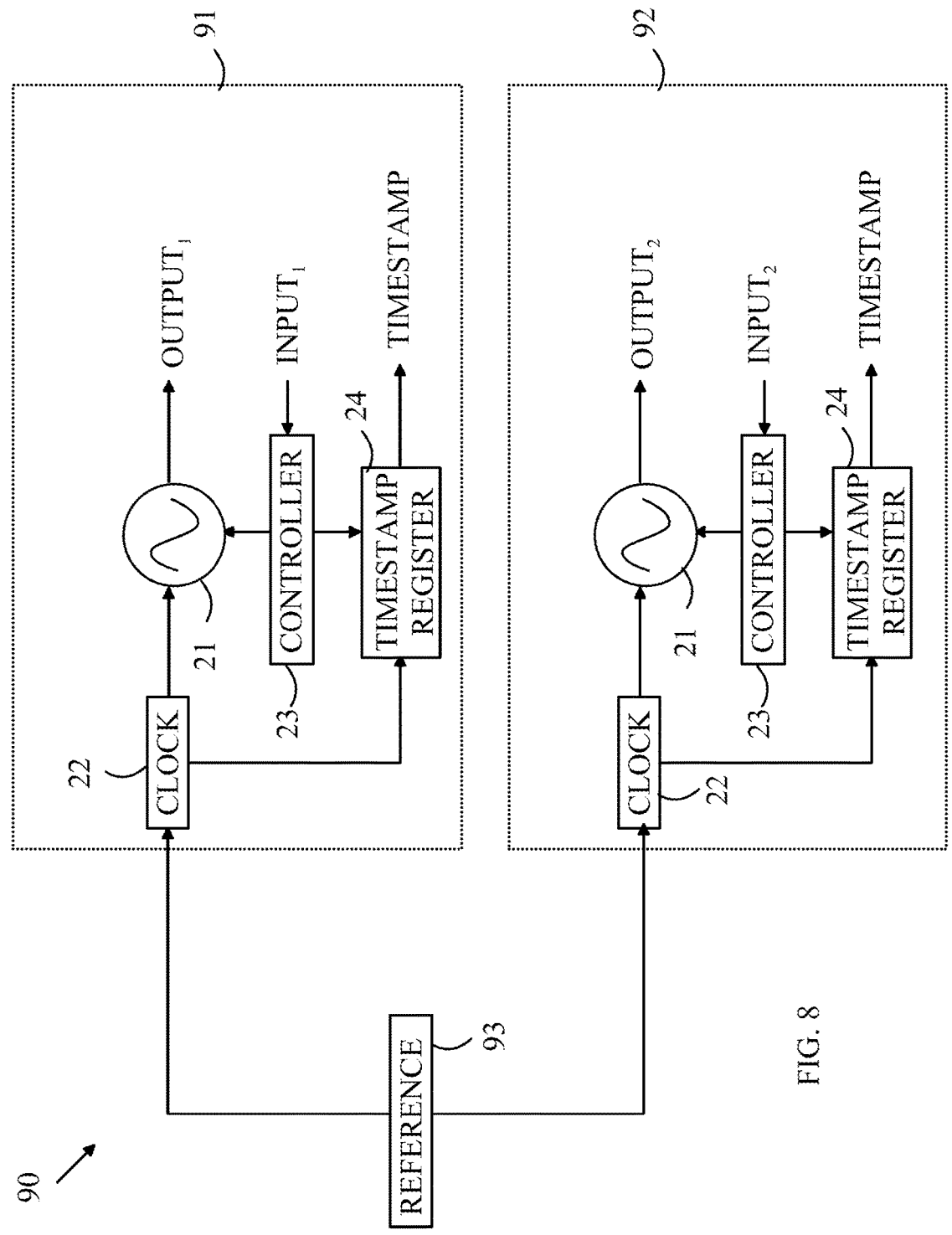
FIG. 8 illustrates a system having multiple frequency sources according to the present invention.

A number of frequency sources according to the present invention can be combined to provide a system in which the relative phases between the sources can be controlled by driving the reference clocks in each source from a common frequency reference. Refer now to FIG. 8, which illustrates a system with two frequency sources according to the present invention. System 90 has two component frequency sources according to the present invention as shown at 91 and 92. Each component frequency source has its own reference clock 22, a sine wave generator 21, timestamp register 24, and controller 23. These components operate in the manner discussed above with respect to FIG. 1, and hence, will not be discussed in detail here. The reference clocks are tied to a common reference source 93. The system is calibrated by measuring the differences between the timezero phases of the component sources. In addition, any phase non-linearity as a function of frequency is also measured. The system has the ability to set the frequency and timezero phase of the two output signals independently and at different times.

The above-described embodiments utilize a timezero phase that is the phase of a tone at a point in time that is defined to be the point at which a clock is 0. However, the teachings of the present invention can be applied in any system in which there is a clock that measures absolute time and in which the phase of the output of the signal synthesizer changes continuously over time during any frequency change in that synthesizer without explicitly computing the phase of the signal at t=0 on that clock. Knowing the phase of the signal at any specific time on the clock and the history of changes in frequency and/or phase including the clock at which each change was made and the nature of the change, is sufficient to allow the phase of the signal after the change to be computed in terms of the phase of the signal before the change. If the phase of the signal before the change was known in absolute terms, then the phase of the signal after the change is also known in absolute terms. If the phase of the signal before the change was not known in absolute terms, then the relative phase of the signal in terms of the phase of the signal before the change can be determined. The later case is often sufficient for many measurement problems in which phase changes are the variables of interest.

Accordingly, the term "reference phase", denoted by $\Phi_r$ is defined to be a phase of a tone at a known point in time, $t_r$, referred to as the reference time. The timezero phase is $\Phi_r - \omega t_r$. The clock values captured by the timestamps provide the reference times at which the frequency or phase was changed.

In the above-described embodiments, the clock whose pulses are counted to provide the timestamps is the same clock that is used by the signal synthesizer to control the output of the signal synthesizer. In general, the synthesizer will change frequency or reset the phase of the output at a time determined by some clock. For example, the frequency change will occur on an edge of that clock. The counter that counts the clock pulse to provide the timestamps is likewise synchronized with that clock. Hence, the counter value is an accurate measure of the time at which the frequency change was instituted. At most, the time of the frequency change is offset from the time on the clock by a constant amount that can be determined by a calibration procedure.

In principle, the clock that is used to define the time values that are recorded in the timestamps could be an entirely separate clock. However, in this case, the time represented by counting pulses from this clock could have an uncertainty of half a clock cycle relative to the clock used by the synthesizer. Hence, the timestamp could have an uncertainty of one half a cycle of the timestamp clock. As a result, there would be an error in determining the phase of the signal after the frequency change. At high frequencies, this error could be unacceptable. Hence, using the same clock for synchronizing the synthesizer and the timestamps is preferred.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
a first signal source comprising:
a port adapted to receive a first clock signal comprising a sequence of pulses at a constant clock frequency;
a controller;
a signal synthesizer that generates an output signal characterized by an output signal frequency and an output signal phase, in response to inputs from said controller, said output signal initially having a tone at a first frequency; and
a first timestamp register that counts pulses from said first clock signal,
said controller being adapted to receive a command to change said output signal frequency from said first frequency to a second frequency, said controller causing said signal synthesizer to change said output signal frequency to said second frequency and to generate a frequency change timestamp from said first timestamp register indicating a time at which said output signal changed from said first frequency to said second frequency.

2. The apparatus of claim 1 wherein said controller sets said output signal phase to a known phase in response to a phase setting command and generates a timestamp indicating when said output signal phase was changed to said known phase.

3. The apparatus of claim 1 wherein said signal synthesizer changes frequency at times determined by said first clock signal.

4. The apparatus of claim 1 wherein said controller computes a second frequency reference phase corresponding to said second frequency from said frequency change timestamp, a first frequency reference phase, and said first and second frequencies.

5. The apparatus of claim 1 wherein said output signal is a sinusoid.

6. The apparatus of claim 1 wherein said signal synthesizer is a DDS.

7. The apparatus of claim 1 wherein said signal synthesizer is a fractional-N synthesizer.

8. The apparatus of claim 1 further comprising a mixer characterized by an input port, an LO port, and an IF output port, said output signal being connected to said LO port.

9. The apparatus of claim 8 further comprising a receiver comprising:
   a receiver signal port connected to said IF port;
   an ADC that generates one digital value from an IF signal leaving said IF port in response to each clock pulse from an ADC clock;
   an ADC clock register that includes an ADC timestamp value that is incremented on each clock pulse from said ADC clock; and
   a processor that records a sequence of said digital values starting at a first time and said ADC timestamp value at said first time.

10. The apparatus of claim 9 wherein said processor causes said controller to change said first frequency to said second frequency and reads said frequency change timestamp generated by changing said first frequency to said second frequency.

11. The apparatus of claim 10 wherein said processor determines a phase of a component of said IF signal after said controller changes said first frequency to said second frequency, said phase of said IF component being independent of phase changes introduced by said change in frequency from said first frequency to said second frequency.

12. The apparatus of claim 11 wherein said processor causes said ADC to generate a sequence of digital values starting at a starting time, said sequence of digital values being processed by said processor to determine said phase of said IF component, said determined phase being independent of said starting time.

13. A system comprising first and second component frequency sources and a common reference source that generates a common reference source signal, each component frequency source comprising:
   a reference clock that generates a clock signal comprising a sequence of pulses at a constant clock frequency;
   a controller,
   a signal synthesizer that generates an output signal in response to inputs from said controller, said output signal having a first frequency determined by said constant clock frequency; and
   a timestamp register that counts pulses from said clock signal,
   said controller being adapted to receive a command signal that indicates a change in said output signal frequency to a second frequency, or a change in said output signal phase to a new phase, said controller causing said signal synthesizer to change said output signal to a new output signal having said second frequency or said new phase, respectively, and to generate a change timestamp from said timestamp register indicating a time at which said a output signal changed,
   said common reference source coupling said common reference source signal to each of said reference clocks in said component frequency sources, said constant clock frequency in each of said component frequency sources being synchronized to said common reference source signal.

14. A method for determining the phase of a tone generated by a signal synthesizer when said tone changes frequency from a first frequency to a second frequency at time $t_s$, said method comprising:
   providing a clock register that is incremented at a constant rate and not reset while said signal synthesizer is being utilized for a measurement of interest that depends on said phase;
   generating a timestamp from said clock register at $t_s$; and
   determining said phase of said tone at times after $t_s$ from said timestamp, using said first and second frequencies and a phase of said tone at a known value of said clock register at a time prior to $t_s$.

15. The method of claim 14 further comprising causing said signal synthesizer to change from said first frequency to said second frequency at a time determined by a time at which said clock register was incremented.

16. The method of claim 14 further comprising setting said phase of said signal synthesizer to a known phase at a time prior to $t_s$ and generating a timestamp from said clock register at that time.

17. The method of claim 14 further comprising using said signal synthesizer output as an LO signal to a mixer and determining a phase offset of an IF signal generated by said mixer using said determined phase of said tone.

* * * * *